(12) United States Patent
Lee et al.

(10) Patent No.: US 7,554,860 B1
(45) Date of Patent: Jun. 30, 2009

(54) NONVOLATILE MEMORY INTEGRATED CIRCUIT HAVING ASSEMBLY BUFFER AND BIT-LINE DRIVER, AND METHOD OF OPERATION THEREOF

(75) Inventors: Poongyeub Lee, Cupertino, CA (US); Ming-Chi Liu, Sunnyvale, CA (US)

(73) Assignee: Actel Corporation, Mountain View, CA (US)

( * ) Notice: Subject to any disclaimer, the term of this patent is extended or adjusted under 35 U.S.C. 154(b) by 102 days.

(21) Appl. No.: 11/859,073

(22) Filed: Sep. 21, 2007

(51) Int. Cl.
*G11C 7/10* (2006.01)

(52) U.S. Cl. .................. 365/189.05; 365/154; 365/205

(58) Field of Classification Search ............ 365/189.05, 365/154, 205, 185.23
See application file for complete search history.

(56) References Cited

U.S. PATENT DOCUMENTS 6,046,942 A * 4/2000 Hwang et al. .......... 365/189.05
6,137,315 A    10/2000 Zettler
6,369,632 B1 * 4/2002 Barnes ..................... 327/211
6,707,721 B2 * 3/2004 Singh et al. ............ 365/189.05

FOREIGN PATENT DOCUMENTS

WO         98/58384 A1    12/1998

* cited by examiner

*Primary Examiner*—Anh Phung
(74) *Attorney, Agent, or Firm*—Lewis and Roca LLP

(57) ABSTRACT

An assembly buffer and bitline driver circuit has two inverters cross-coupled to form an assembly buffer. A high-voltage latch is formed from cross-coupled high-voltage inverters. A first low-voltage n-channel MOS transistors is coupled to the high-voltage latch to selectively ground the output of the first high-voltage inverter and a second low-voltage n-channel MOS transistors is coupled to the high-voltage latch to selectively ground the output of the other high-voltage inverter. The gate of the first low-voltage n-channel MOS transistor is coupled to one output of one of the inverters forming the assembly buffer latch and the gate of the second low-voltage n-channel MOS transistor is coupled to the output of the other one of the inverters forming the assembly buffer latch. A pre-load circuit is used to prevent data in an unselected circuit from being disturbed.

7 Claims, 4 Drawing Sheets

NONVOLATILE MEMORY INTEGRATED CIRCUIT HAVING ASSEMBLY BUFFER AND BIT-LINE DRIVER, AND METHOD OF OPERATION THEREOF

BACKGROUND OF THE INVENTION

1. Field of the Invention

The present invention relates to memory integrated circuits. More particularly, the present invention relates to assembly buffers in memory integrated circuits.

2. The Prior Art

A memory integrated circuit includes a nonvolatile memory array unit such as a flash memory that is programmed in page mode. A volatile assembly buffer memory is connected to the memory array, and is at least a page in size so that an entire or partial page of data that is to be programmed may be stored therein.

Such an arrangement provides a single readily accessible and fully functional volatile memory that supports a variety of data operations such as providing data to the bit line driver (BLDRV) for nonvolatile memory programming, producing a target data compared with nonvolatile memory data when in program verify mode, and other operations including, in particular, operations that can benefit from the availability of a fast volatile memory to store an entire or partial page of program data, or to read data.

A bit line driver is connected to the assembly buffer memory and the memory array, and is at least a page in size so that an entire or partial page of data that is being programmed may be kept in the bit line driver during programming, thereby providing actual programming voltage or programming inhibit voltage to the memory array. As $V_{CC}$ levels decrease, and semiconductor processes employ much finer geometries including thinner oxide layers, narrower interconnect line spacing, and higher line resolution, the latched data can be damaged by more parasitic capacitance, and cross talk in the compact area. In addition, lower $V_{CC}$ levels and higher threshold voltage associated with the high voltage transistors is not enough to maintain the bit line driver data transferred from the assembly buffer memory.

FIG. 1 is a schematic diagram showing a typical prior-art assembly buffer memory and bit line driver that are used for programming a nonvolatile memory such as a flash memory in page mode. The assembly buffer memory is a type of latch circuit formed from low-voltage transistors to store programming data. The bit line driver is a high-voltage circuit.

In FIG. 1, n-channel MOS transistors 10, 12, 14, and 16, are low voltage transistors, which have relatively thin oxides and a low voltage operating range. Inverters 18, 20 and 22 are formed from low-voltage n-channel transistors. These components form the assembly buffer memory in which inverters 18 and 20 form a data latch. The data latch is loaded with data from the data-in driver when n-channel MOS transistor 16 is turned on by asserting the YS (Y-select) signal on its gate and n-channel MOS transistor 10 is turned on by asserting the LDABF (load assembly buffer) signal on its gate to force the latch to the state set by the input data. For example, a "zero" logic state at the data-in driver will force the input of inverter 18 to a low logic state and the feedback action of inverter 20 will reinforce that state after n-channel MOS transistor 10 has been turned off. YS is a y-select signal determined by a y-addresses signal and is used to select a specific assembly buffer memory through n-channel MOS transistor 16.

The data in the assembly buffer latch can be read by asserting the RDABF (read assembly buffer) signal on the gate of n-channel MOS transistor 14 and asserting the YS (Y-select) signal on the gate of n-channel MOS transistor 16. If a zero logic state has been stored in the latch as previously described, the output of inverter 18 will be at a high logic state, turning on n-channel MOS transistor 12. When n-channel MOS transistor 14 is turned on by asserting the RDABF (read assembly buffer) signal on its gate, the column line (COL) will be pulled low through n-channel MOS transistor 12. Persons of ordinary skill in the art will appreciate the actions that will result from the write and read operations if a "one" logic state is present at the data-in driver and is thus stored in the latch. Inverter 22 buffers the output of the latch presented to the bit line driver portion of the circuit.

The bit line driver includes p-channel MOS transistors 24 and 26, and n-channel MOS transistors 28, 30, 32, and 34. P-channel MOS transistors 24 and 26 are high voltage transistors, and n-channel MOS transistors 28, 30, 32, and 34 are also high-voltage transistors. Both n-channel and p-channel high-voltage transistors have relatively thicker oxides and a high-voltage operating range. P-channel MOS transistor 24 and n-channel MOS transistor 28 form a first high-voltage inverter and p-channel MOS transistor 26 and n-channel MOS transistor 30 form a second high-voltage inverter. Together these components form a high-voltage latch similar to the one formed by inverters 18 and 20 in the assembly buffer memory.

To program a nonvolatile memory cell, about −3 v is required on the bit line, and to prevent or inhibit a cell from being programmed, about +3 v is required on the bit line. Both high positive and negative voltages are supplied by the bit line driver, which is a type of latch circuit consisting of high-voltage transistors to supply the +3 v or −3 v to the bit line from one of the potentials VPY and VEY depending on the data in the assembly buffer memory. The latch may be loaded by turning on n-channel MOS transistor 36 by asserting the CLMPY signal on its gate while the VPY node is at $V_{CC}$ and the VEY node is at ground. After the data has been loaded, n-channel MOS transistor 36 is turned off and then the voltage at the VPY node is raised to, for example, +3V and the voltage at the VEY node is dropped to, for example, −3V. The data may then be written into the memory by turning on n-channel MOS transistor 32 by asserting the signal WRHV (write high voltage) at its gate at a level of, for example, +6V to pass the high voltage to the bit line BL. The contents of the memory cell connected to the bit line BL may be read by turning on n-channel MOS transistor 34 by asserting the COLSA (column sense amp) signal on its gate and turning on n-channel MOS transistor 16 by asserting the YS signal on its gate.

In the circuit of FIG. 1, signal nodes YS, LDABF, RDABF, LDAT, LDATB, LDATB1 and COL have an operating range of about $V_{CC}$, which is assumed to be the lowest power supply voltage in the integrated circuit device. The signals LDABF (load assembly buffer) and RDABF (read assembly buffer) are common signals for all assembly buffer circuits. Node DL (data line) is connected to a sense amplifier or data-in driver.

Circuits like that shown in FIG. 1 suffer from certain weaknesses. First, LDABF is a common signal line for every assembly buffer memory. LDABF is high for all assembly buffer memory even if no data is to be written into assembly buffer memory, by having the signal YS low thus not turning on n-channel MOS transistor 16. For the unselected assembly buffer memory, charge sharing occurs between the input of inverter 18 and the column line COL through n-channel MOS transistor 10 when swinging the LDABF signal from ground to $V_{CC}$.

Usually, to save layout area, inverters 18 and 20 are made very small in size and are therefore relatively weak. If the input to inverter 18 is at the $V_{CC}$ state latched by the feedback loop and the column line COL is in a floating state such as at ground potential, charge sharing can cause the input of inverter 18 to drop and the floating column line COL node to rise. If the voltage drop at the input of inverter 18 goes low enough to go beyond the logic threshold, the latched data will be flipped to the opposite polarity, resulting in the assembly buffer memory data to be destroyed unexpectedly. For the case in which the input of inverter 18 is low and the column line COL is floating at $V_{CC}$, the same malfunction can occur in the other direction. Secondly, although the data line DL may experience the full swing between $V_{CC}$ and ground when driven by the data-in driver, the DL voltage, especially $V_{CC}$, cannot be transferred to the column line COL node, because YS is $V_{CC}$ for a selected assembly buffer memory and there is a $V_{tn}$ voltage drop across n-channel MOS transistor 16. That means that the column line COL can have only $V_{CC}-V_{tn}$ and not the full $V_{CC}$. Under some design conditions, this dropped voltage on the column line COL is not enough to flip the assembly buffer memory latch data, meaning that careful design consideration must be given to the size of the transistor 10 and the transistors in inverters 18 and 20 to ensure writing operation.

There are other weaknesses in the circuit of FIG. 1. CLMPY has some protective voltage on n-channel MOS transistor 36 to protect and isolate the low-voltage transistor area from high voltages such as VPY and VEY which can reach +3 v and –3 v. For example, if the voltage at CLMPY is 1.8 v, the output of inverter 22 cannot be at a voltage higher than 1.8 v–$V_t$, where $V_t$ is threshold voltage of n-channel MOS transistor 36. The data in the assembly buffer memory is transferred into BLDRV through n-channel MOS transistor 36, which is also a high-voltage transistor.

The detailed operation of the circuit of FIG. 1 can be understood by examining FIG. 2, which shows the various signal waveforms used to enter programming mode. The waveforms break into two groups in which one is for a program voltage (–3 v) to the bit line, and the other is for an inhibition voltage (+3 v) to the bit line. The first problem is observed when the signal WRHV at the gate of n-channel MOS transistor 32 is enabled by increasing it from 0 v to 6 v. As may be seen from FIG. 2, after the signal WRHV reaches a level of voltage high enough to turn on n-channel MOS transistor 32, the signals VEY and HLDAT (applying an inhibit voltage to the bit line), or VPY and HLDATB (applying a programming voltage to the bit line) have some glitches in a positive or negative direction depending on the initial condition of the bit line BL which is usually loaded by a relatively large capacitance. The positive or negative glitches can cause the high-voltage transistor latch to erroneously flip, because n-channel MOS transistor 36 is shut off to prevent leakage current through the transistor by the VEY bias right after the VEY supply starts pumping down. If the glitch is large enough to change the state of the latched data, an error might be associated with an addressed cell coupled to the bit line. The signal WRHV requires some special treatment to prevent that kind of problem.

Secondly, there is another major problem that exists due to the higher threshold voltage for the high-voltage transistors when $V_{CC}$ is low. From FIG. 2, it may be seen that VPY should stay at $V_{CC}$ before entering programming mode. During standby mode, BLDRV latch data is set through n-channel MOS transistor 36. Even though inverter 22 and n-channel MOS transistor 36 are strong enough to overcome the strength of p-channel MOS transistor 26 and n-channel MOS transistor 30, the high-voltage bit line driver latch is not in a normal operating mode, because p-channel MOS transistor 24, p-channel MOS transistor 26, n-channel MOS transistor 28, and n-channel MOS transistor 30 could be in an off state under some extreme conditions as previously mentioned. For instance, if the data out of inverter 22 is $V_{CC}$, then HLDATB should be $V_{CC}$, but if p-channel MOS transistor 24 and n-channel MOS transistor 28 are turned off because $V_{gs}<V_{th}$, the high-voltage bit line driver latch cannot guarantee the state of HLDAT. To supply negative voltage like VEY, the signal CLMPY must be shut off following application of the VEY voltage, then the high-voltage bit line driver latch is isolated from the assembly buffer memory. An unstable HLDAT can make the high-voltage bit line driver latch assume an opposite state. For the case of the output of inverter 22 being at ground, a similar problem occurs.

In the prior art as exemplified by the circuit of FIG. 1, a low-voltage assembly buffer circuit is separated from a high-voltage bitline driver circuit by a single isolation transistor 36. Because the lowest possible value of the supply voltage $V_{CC}$ can be lower than the highest possible threshold voltage for the bitline driver circuit, data may not be effectively transferred from the low-voltage assembly buffer circuit to the high-voltage bitline driver circuit.

BRIEF DESCRIPTION OF THE INVENTION

According to the present invention, an assembly buffer and bitline driver circuit has two inverters cross-coupled to form an assembly buffer. A high-voltage latch is formed from cross-couple high-voltage inverters. A first low-voltage n-channel MOS transistors is coupled to the high-voltage latch so as to selectively ground the output of a first one of the high-voltage inverters and a second low-voltage n-channel MOS transistors is coupled to the high-voltage latch so as to selectively ground the output of the other one of the high-voltage inverters. The gate of the first low-voltage n-channel MOS transistor is coupled to one output of one of the inverters forming the assembly buffer latch and the gate of the second low-voltage n-channel MOS transistor is coupled to the output of the other one of the inverters forming the assembly buffer latch. In this way, data in the form of a logic zero can be forced onto either side of a high-voltage latch. Thus, a logic zero may then be forced to one side of the latch to load a logic zero into the latch, and a logic zero may be forced to the other side of the latch to load a logic one into the latch, thereby eliminating the necessity to write a logic one into the latch. In addition, a pre-load scheme is used to prevent data in an unselected circuit from being disturbed.

The present invention addresses problems caused by the use of a low $V_{CC}$ potential. The present invention provides very reliable write operation from the assembly buffer circuit, and guarantees safe data transfer from the assembly buffer circuit to the bit line driver circuit. The present invention can ensure supplying program or inhibition voltage to bit line without destroying bit line driver latch data.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

Figure 1:
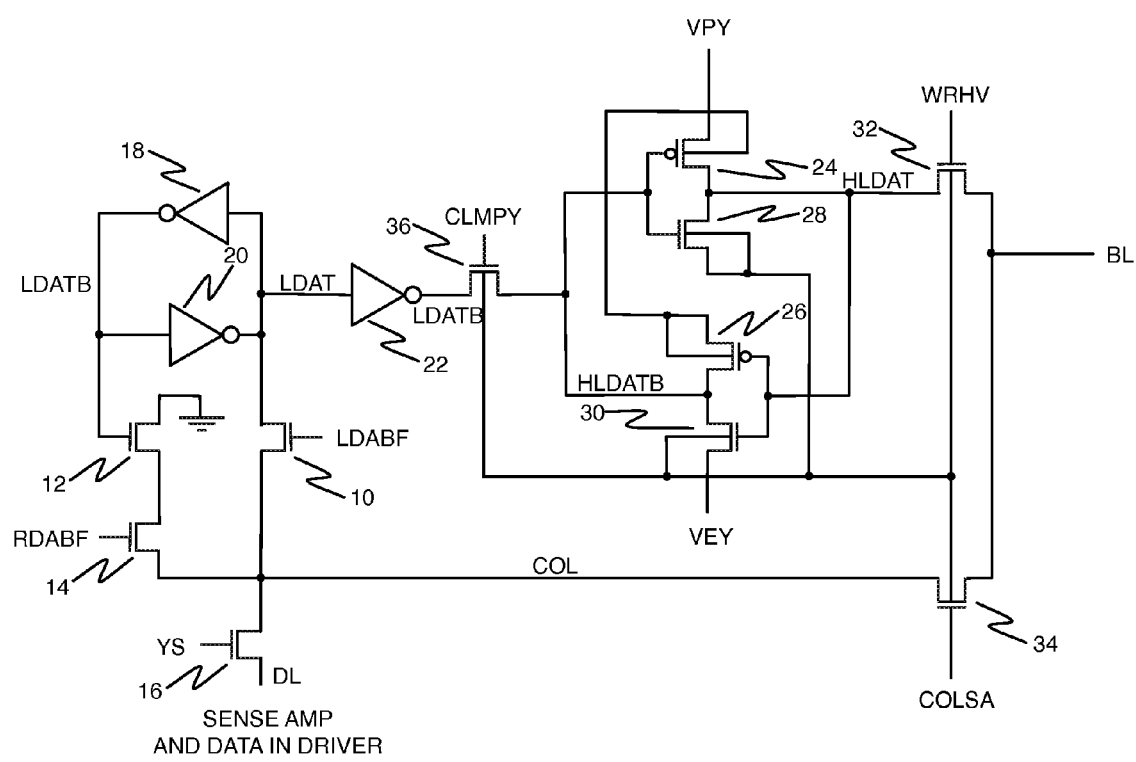
FIG. 1 is a schematic diagram of a prior-art assembly buffer and bit line driver combination.
Figure 2:
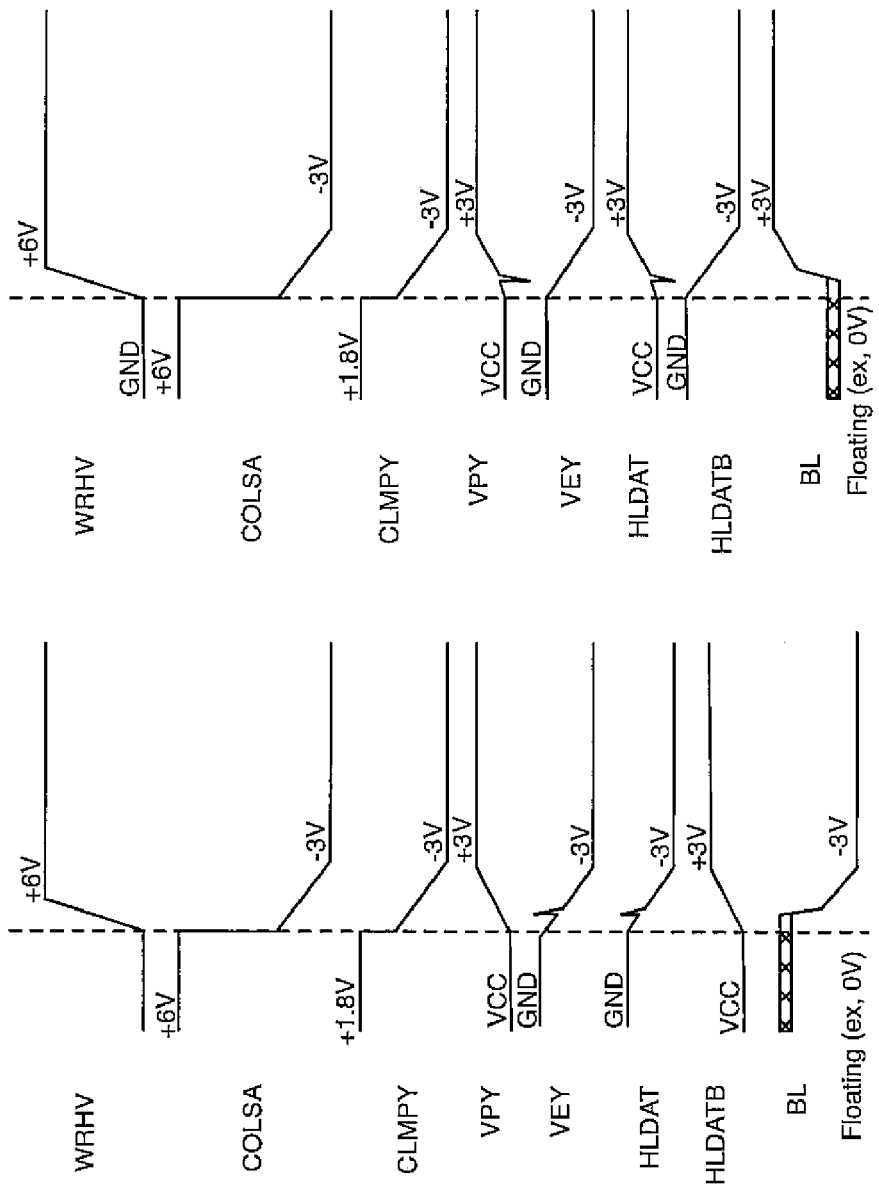
FIG. 2 is a series of waveforms associated with the circuit of FIG. 1.
Figure 3:
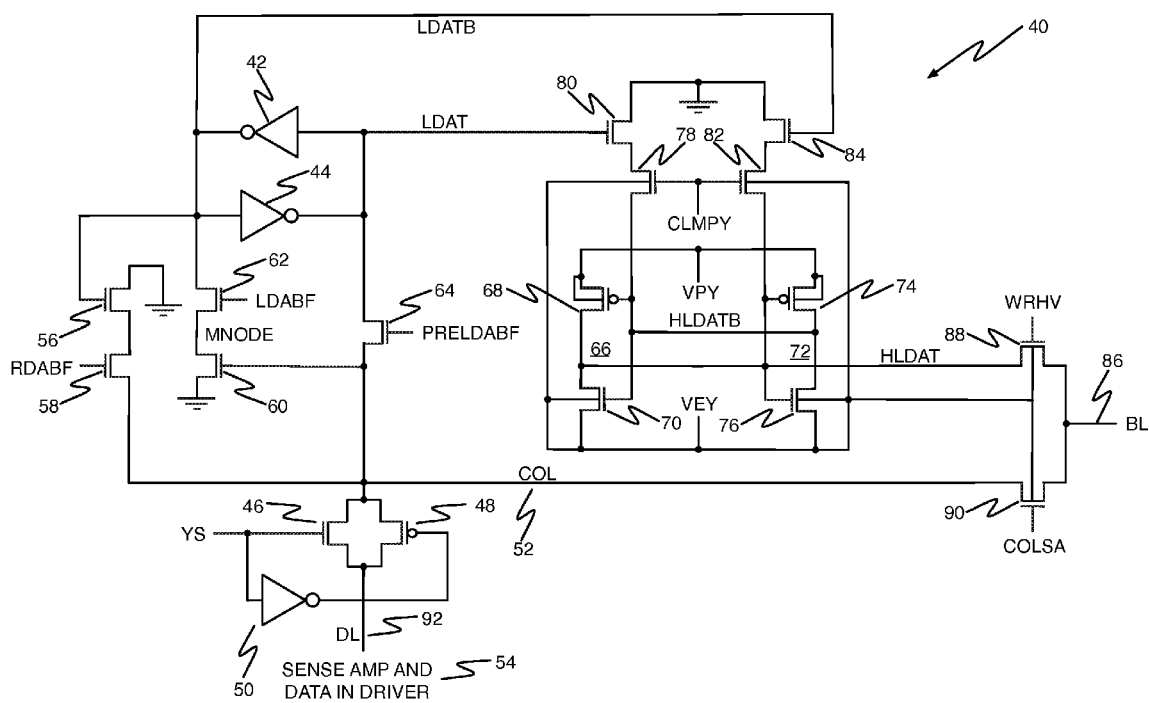
FIG. 3 is a schematic diagram of an assembly buffer and bit-line driver circuit for a nonvolatile memory integrated circuit according to the present invention.

The present invention resolves the problems found in prior-art circuits like that of FIG. 1. FIG. 3 is a schematic diagram showing an exemplary assembly buffer and bit-line driver circuit 40 according to the principles of the present invention.

To program a nonvolatile memory cell, the bitline (BL) requires −3 v, and to prevent or inhibit a cell from being programmed, BL requires +3 v. Both high positive and negative voltage are supplied by BLDRV. BLDRV is a type of latch circuit consisting of high-voltage transistors to supply +3 v or −3 v to BL depending on assembly buffer memory data. An assembly buffer memory is a type of latch circuit consisting of low-voltage transistors to store programming data.

Inverters 42 and 44 form a data latch. N-channel MOS transistor 46, p-channel MOS transistor 48, and inverter 50 are used to form a pass gate coupled between a column line (COL) 52 and a sense amplifier and data-in driver 54.

Reading of the state of the data latch is performed through n-channel MOS transistors 56 and 58. N-channel MOS transistor 56 buffers and inverts the state of the output of inverter 42. N-channel MOS transistor 58 couples the data output at the drain of n-channel MOS transistor 56 to column line 52 when the signal RDABF is asserted high.

Writing data from the column line 52 into the data latch is performed through n-channel MOS transistors 60, 62, and 64. The data on column line 52 is buffered and inverted by n-channel MOS transistor 60. N-channel MOS transistor 62 couples the input data at the drain of n-channel MOS transistor 60 to the input of inverter 44 when the signal LDABF is asserted high. N-channel MOS transistor 64 couples the data from column line 52 to the input of inverter 42 when the signal PRELDABF is asserted high.

A high-voltage latch is formed from a pair of cross-coupled inverters comprising first inverter 66 including p-channel MOS transistor 68 in series with n-channel MOS transistor 70 between voltage potentials VPY and VEY, and a second inverter 72 including p-channel MOS transistor 74 in series with n-channel MOS transistor 76 between voltage potentials VPY and VEY. The gates of p-channel MOS transistor 68 and n-channel MOS transistor 70 are coupled to ground through n-channel MOS transistors 78 and 80 connected in series, and the gates of p-channel MOS transistor 74 and n-channel MOS transistor 76 are coupled to ground through n-channel MOS transistors 82 and 84 connected in series.

The output of inverter 44 is coupled to the gate of n-channel MOS transistor 80 and the output of inverter 42 is coupled to the gate of n-channel MOS transistor 84. The gates of n-channel MOS transistors 78 and 82 are connected to the signal CLMPY. The common drain connections of p-channel MOS transistor 68 and n-channel MOS transistor 70 are coupled to the bitline BL 86 through n-channel MOS transistor 88, and the common drain connections of p-channel MOS transistor 74. The gate of n-channel MOS transistor 88 is coupled to the signal WRHV and the gate of n-channel MOS transistor 90 is coupled to the signal COLSA.

Nodes YS, LDABF, PRELDABF, RDABF, LDAT, LDATB and COL have an operating-voltage swing of $V_{CC}$, which is assumed to be the lowest power supply voltage in the device. The signals LDABF, RDABF and PRELDABF are common signals for all assembly buffer memory locations. Node DL (data line) 92 is connected to the sense amplifier and data-in-driver 54. The signal YS is a y-select signal used to select a specific assembly buffer memory location through the pass gate comprising MOS transistors 46 and 48. The assembly buffer is accessed through n-channel MOS transistor 62 controlled by the signal LDABF, n-channel MOS transistor 60 coupled to column line 52 and n-channel MOS transistor 64 controlled by the signal PRELDABF to write data in, or through n-channel MOS transistor 56 coupled to the signal LDATB and n-channel MOS transistor 58 controlled by RDABF to read data out, of the assembly buffer memory. In FIG. 3, n-channel MOS transistors 46, 46, 56, 58, 60, 62, 64, 80, and 84 are low voltage transistors, and inverters 42, 44, and 50 are inverters formed from low-voltage n-channel and p-channel MOS transistors. P-channel MOS transistors 68 and 74 are high-voltage transistors, and n-channel MOS transistors 70, 76, 78, 82, 88, and 90 are high-voltage transistors. Persons of ordinary skill in the art will observe that the low-voltage output of the assembly buffer latch formed from inverters 42 and 44 is effectively isolated from the high voltage latch since the low-voltage latch is only coupled to the gates of low-voltage n-channel transistors 80 and 84.

To write/read data to/from assembly buffer memory, the signal COLSA is asserted low to turn off the path through n-channel MOS transistor 90 to the bitline BL 86. When it is desired to write data into assembly buffer memory, DL 92 is driven by data-in-driver 54 with $V_{CC}$ or ground according to the desired data value, and the addressed and decoded YS line at the gate of n-channel MOS transistor 46 should be at $V_{CC}$ while other non-addressed YS lines should be at ground.

As long as low signals at LDABF and PRELDABF keep n-channel MOS transistors 62 and 64 turned off, the previously written data remains latched data until next LDABF and PRELDABF signals are asserted. When it is desired to read data out of the assembly buffer memory, the signal RDABF is asserted high, turning on n-channel MOS transistor 58 and the YS signal turns on the pass gate formed from transistors 46 and 48 to couple the data to DL 92 and thus to the sense amplifier 54. The conductivity of n-channel MOS transistor 56 is determined by the state of LDATB at the output of inverter 42, which causes the sense amplifier to sense the data from the assembly buffer memory.

Figure 4:
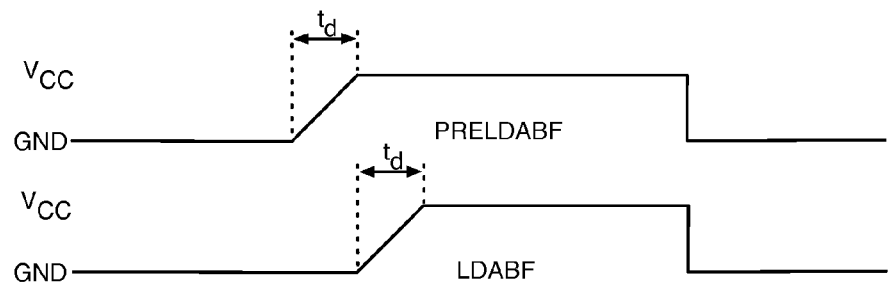
FIG. 4 is a timing diagram showing the timing of signals PRELDABF and LDABF associated with the circuit of FIG. 3.

The problems inherent in the prior art are resolved using the present invention as may be seen by an examination of FIG. 4, a timing diagram showing the timing of signals PRELDABF and LDABF. The signals PRELDABF and LDABF are common to every assembly buffer memory location, so the state of the signal YS at the gate of n-channel MOS transistor 46 controls the input and output of data. When data is written, the LDABF is high for all assembly buffer memory locations. The column line COL 52 for unselected memory locations will be charged to an unspecified voltage since transistor 90 and transistors 46 and 46 are turned off. As shown in FIG. 4, the signal PRELDABF is slowly ramped up with time delay $t_d$ to provide enough time to charge the floating nodes COL 52 and MNODE at the drain of n-channel MOS transistor 60 for the unselected assembly buffer memory locations to the voltage at the output of inverter 44 without large voltage excursions due to charge sharing effects. The signal LDABF is not asserted until after the time delay $t_d$. The time delay $t_d$ may be about 3 nsec. After completing assertion of PRELDABF, LDABF is also ramped up slowly during the period $t_d$ as shown in FIG. 4. This is done because MNODE is floating if the nodes COL and LDAT are at a logic low state. In this way, data can be protected from the effects of charge sharing between MNODE and LDATB.

By using the pass gate consisting of MOS transistors 46 and 48, the voltage on DL 94 can be transferred to COL 52 node without the $V_{tn}$ voltage drop, because p-channel MOS transistor 48 makes the full $V_{CC}$ potential transfer and n-channel MOS transistor 46 makes full ground potential transfer. COL 52 is thus driven by full ground and $V_{CC}$. By adding n-channel MOS transistors 60 and 62, the writing of logic high data can be ensured, since $V_{CC}$ on COL 52 can pull the LDATB node at the output of inverter 42 down to ground very strongly. The writing of low logic level data is ensured by the path through n-channel MOS transistors 46 and 64.

The signal CLMPY places some protective voltage on n-channel MOS transistors 78 and 82 to protect low-voltage n-channel MOS transistors 80 and 84 from the high voltage potentials VPY and VEY which can reach +3 v and −3 v, respectively. In contrast to the prior-art as exemplified by the circuit of FIG. 1, circuits according to the present invention remove the n-channel path through n-channel MOS transistor 36 between the nodes ABF and BLDRV of the circuit of FIG. 1. Instead, by adding strong n-channel MOS transistors 80 and 84 to determine the BLDRV latch state and optimizing signal inputs of CLMPY, VPY, VEY, WRHV and COLSA, the problems inherent in circuits like that shown in FIG. 1 are eliminated.

Figure 5:
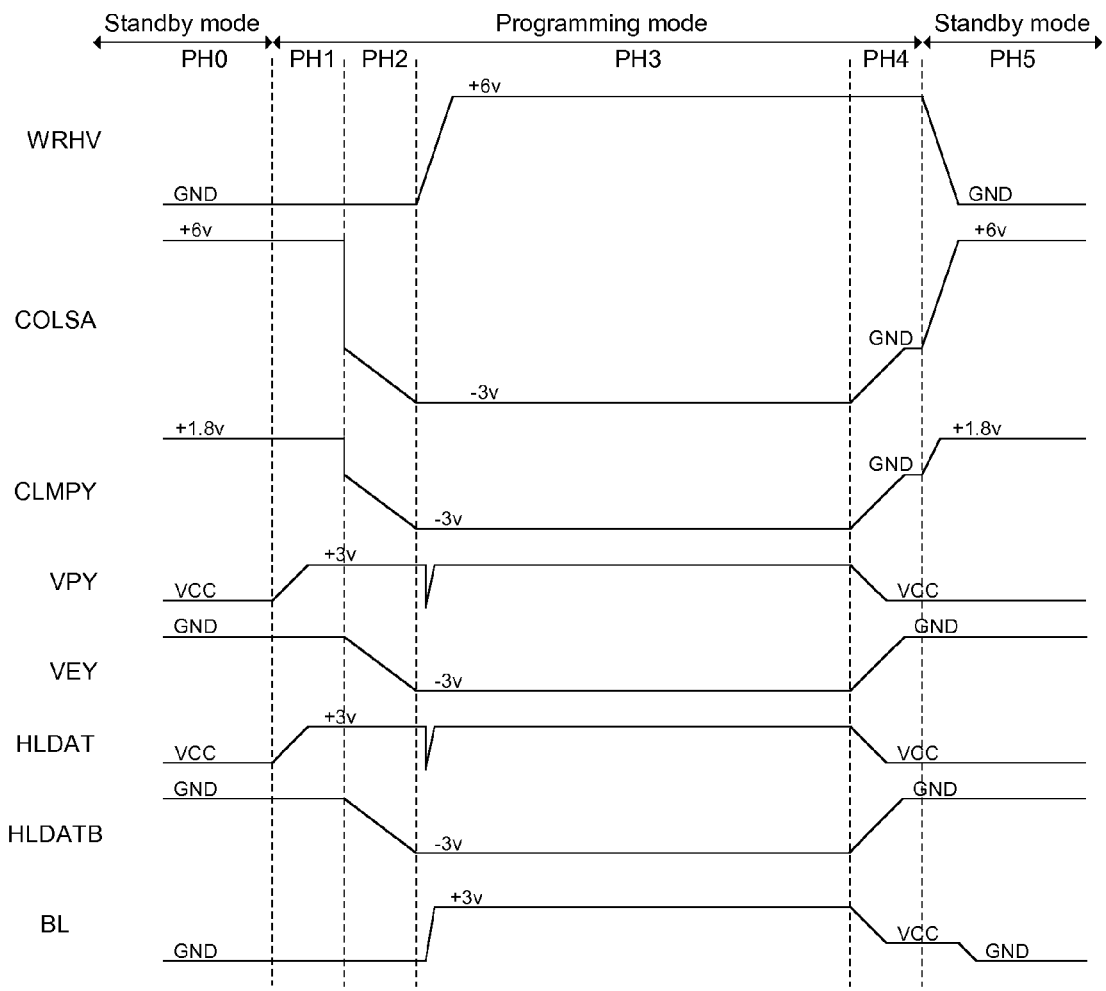
FIG. 5 is a timing diagram showing the timing of signals WRHV, COLSA, CLMPY, VPY, VEY, HLDAT, HLDATB, and BL associated with the circuit of FIG. 3.

The detailed operation of the circuit of FIG. 3 can be understood by examining FIG. 5, which shows the timing of signals WRHV, COLSA, CLMPY, VPY, VEY, HLDAT, HLDATB, and BL associated with the circuit of FIG. 3 to enter programming mode. PH0 is the phase before programming mode in which data in ABF is already set up. In PH1, VPY is raised from $V_{CC}$ to +3 v so that BLDRV latch has plenty of time to pull down HLDAT or HLDATB by either n-channel MOS transistor 80 or 84. Before PH2 starts, VPY is already at +3 v. In PH2, VEY starts ramping down towards −3 v until the high-voltage bitline driver latch eventually has +3 v on VPY and −3 v on VEY, a state at which the latch is very stable. Moreover, the VEY voltage can be transferred through n-channel MOS transistor 88 even with WRHV=0 v. At this point, all selected bit lines are already charged up with −3 v in PH2. In PH3, WRHV is enabled, swinging from 0 v to 6 v. Even though there is a voltage drop on VPY (shown in FIG. 5) due to charge sharing caused by big bit line capacitance loading, all programmed bit lines are already charged up with VEY (−3 v) in PH2, so the VEY voltage is very stable at −3 v. Even voltage drops of around up to 0 v on the common drain connections of MOS transistors 68 and 70 doesn't affect BLDRV latch data because −3 v is already present. PH4 is a discharge phase and PH5 returns the circuit to standby mode in which all bit lines are discharged to ground after the signal COLSA at the gate of n-channel MOS transistor 90 reaches 6 v.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An assembly buffer and bitline driver circuit including:
   a data line;
   a column line;
   a bit line;
   a Y-select line;
   two low-voltage inverters cross-coupled to form an assembly buffer latch, the assembly buffer latch having a first output coupled to the column line and a second complementary output;
   a first switch coupled between the data line and the column line, the first switch having a control element coupled to the Y-select line;
   a second switch coupled between the column line and the bit line, the second switch having a control element coupled to a column select signal line;
   two high-voltage inverters cross-coupled to form a bitline driver latch, the bitline driver latch having a first output coupled to the bit line and a second complementary output;
   a first low-voltage n-channel MOS data-transfer transistor coupled between the output of the first high-voltage inverter and ground, a gate of the first low-voltage n-channel MOS transistor coupled to the complementary output of the assembly buffer latch; and
   a second low-voltage n-channel MOS data-transfer transistor coupled between the output of the second high-voltage inverter and ground, a gate of the second low-voltage n-channel MOS transistor coupled to the output of the assembly buffer latch.

2. The assembly buffer and bitline driver circuit of claim 1, wherein the first switch is a pass gate.

3. The assembly buffer and bitline driver circuit of claim 1, wherein the first switch is an n-channel MOS column-select transistor having a gate coupled to the column select line.

4. The assembly buffer and bitline driver circuit of claim 1, further including a pre-load circuit configured to prevent data in an unselected circuit from being disturbed.

5. The assembly buffer and bitline driver circuit of claim 4, wherein the preload circuit includes:
   a first n-channel MOS transistor having a drain coupled to the complemetary output of the assembly buffer latch, a source, and a gate coupled to a LDABF signal line;
   a second n-channel MOS transistor having a drain coupled to the source of the first n-channel MOS transistor, a source coupled to ground, and a gate coupled to the column line; and
   a third n-channel MOS transistor having a drain coupled to the output of the assembly buffer, a source coupled to the column line, and a gate coupled to a PRELDABF signal line.

6. The assembly buffer and bitline driver circuit of claim 1, wherein the first output of the bitline driver latch is coupled to the bit line through an n-channel MOS write-high-voltage transistor having a gate coupled to a write-high-voltage signal line.

7. The assembly buffer and bitline driver circuit of claim 1, further including:
   a first n-channel MOS assembly-buffer-read transistor having a gate coupled to the complementary output of the assembly buffer latch, a source coupled to ground, and a drain; and
   a second n-channel MOS assembly-buffer-read transistor having a gate coupled to a read-assembly-buffer signal line, a source coupled to the drain of the first n-channel MOS assembly-buffer-read transistor, and a drain coupled to the column line.

* * * * *